(12) United States Patent
Essawy et al.

(10) Patent No.: US 11,472,562 B2
(45) Date of Patent: Oct. 18, 2022

(54) HEALTH MONITORING OF AN ELECTRICAL HEATER OF AN AIR DATA PROBE

(71) Applicant: Rosemount Aerospace Inc., Brunsville, MN (US)

(72) Inventors: Magdi A. Essawy, Lakeville, MN (US); Kaare Josef Anderson, Farmington, MN (US); Darren G. Jackson, Prior Lake, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 602 days.

(21) Appl. No.: 16/442,196

(22) Filed: Jun. 14, 2019

(65) Prior Publication Data

US 2020/0391871 A1 Dec. 17, 2020

(51) Int. Cl.
*G01R 31/08* (2020.01)
*B64D 15/12* (2006.01)
(Continued)

(52) U.S. Cl.
CPC ........... *B64D 15/12* (2013.01); *G01R 31/008* (2013.01); *B64D 43/02* (2013.01);
(Continued)

(58) Field of Classification Search
CPC .............. B64F 5/60; B64D 2045/0085; B64D 2013/0603; G01R 31/008; G01R 31/50
See application file for complete search history.

(56) References Cited

U.S. PATENT DOCUMENTS 3,798,652 A 3/1974 Williams
4,121,088 A * 10/1978 Doremus ............... B64D 15/16
219/505
(Continued)

FOREIGN PATENT DOCUMENTS

CA 1311028 5/1989
CN 1330766 A * 1/2002 ............. G01K 13/02
(Continued)

OTHER PUBLICATIONS

Bechhoefer, John, et al. "Temperature Dependence of the Capacitance of a Ferroelectric Material." in: American Journal of Physics (2007), vol. 75, No. 11, pp. 1046-1053.
(Continued)

*Primary Examiner* — Patrick Assouad
*Assistant Examiner* — Demetrius R Pretlow
(74) *Attorney, Agent, or Firm* — Kinney & Lange, P.A.

(57) ABSTRACT

Apparatus and associated methods relate to determining health of an electrical heater of an air data probe based on a comparison between a calculated expected value and a measured value of an electrical property of the electrical heater. The expected value of the electrical property is calculated based in part on the electrical power provided to the electrical heater and further based in part on the aircraft flight parameters and/or environmental conditions. Such aircraft flight parameters and/or environmental conditions can include at least one of: electric power source status, airspeed, air pressure, altitude, air temperature, humidity, liquid water content, ice water content, droplet/particle size distribution, angle of attack, and angle of sideslip. These aircraft flight parameters and/or environmental conditions are received via an aircraft interface.

15 Claims, 7 Drawing Sheets

(51) Int. Cl.
    *G01R 31/00*     (2006.01)
    *B64D 45/00*     (2006.01)
    *G01R 31/50*     (2020.01)
    *B64D 43/02*     (2006.01)
    *G01P 5/00*     (2006.01)

(52) U.S. Cl.
    CPC ...... *B64D 2045/0085* (2013.01); *G01P 5/001* (2013.01); *G01R 31/50* (2020.01)

(56) References Cited

U.S. PATENT DOCUMENTS

| | | | |
|---|---|---|---|
| 4,207,566 A | 6/1980 | Gitlin et al. | |
| 4,267,721 A | 5/1981 | Longenecker et al. | |
| 4,506,259 A | 3/1985 | Rhodes | |
| 4,698,583 A | 10/1987 | Sandberg | |
| 5,216,226 A | 6/1993 | Miyoshi | |
| 5,218,294 A | 6/1993 | Soiferman | |
| 5,464,965 A * | 11/1995 | McGregor | G05D 23/2401 219/505 |
| 5,767,781 A | 6/1998 | Yavelberg | |
| 5,847,913 A | 12/1998 | Turner et al. | |
| 5,942,682 A * | 8/1999 | Ghetzler | G01M 9/06 73/147 |
| 5,986,444 A | 11/1999 | Powell | |
| 6,070,475 A | 6/2000 | Muehlhauser et al. | |
| 6,151,560 A | 11/2000 | Jones | |
| 6,188,423 B1 | 2/2001 | Pou | |
| 6,218,647 B1 | 4/2001 | Jones | |
| 6,266,219 B1 | 7/2001 | Macbeth et al. | |
| 6,300,767 B1 | 10/2001 | Kliman et al. | |
| 6,336,083 B1 | 1/2002 | Lanham et al. | |
| 6,370,450 B1 * | 4/2002 | Kromer | G01K 13/02 702/144 |
| 6,400,334 B1 | 6/2002 | Lindenmeier et al. | |
| 6,414,282 B1 * | 7/2002 | Ice | G05D 23/1913 219/508 |
| 6,430,996 B1 | 8/2002 | Anderson et al. | |
| 6,543,298 B2 * | 4/2003 | Cronin | G01K 13/02 73/170.12 |
| 6,560,551 B1 * | 5/2003 | Severson | B64D 15/22 702/54 |
| 6,668,640 B1 * | 12/2003 | Alwin | G01K 13/028 73/170.02 |
| 6,759,962 B2 * | 7/2004 | Severson | G08B 19/02 340/580 |
| 6,906,537 B2 | 6/2005 | Goldberg et al. | |
| 7,012,538 B2 | 3/2006 | Peck et al. | |
| 7,193,428 B1 | 3/2007 | Baron et al. | |
| 7,202,451 B2 | 4/2007 | Uchida et al. | |
| 7,209,651 B1 | 4/2007 | Knoeppel et al. | |
| 7,219,023 B2 | 5/2007 | Banke et al. | |
| 7,490,510 B2 | 2/2009 | Agami et al. | |
| 7,647,843 B2 | 1/2010 | Burton | |
| 7,854,548 B2 * | 12/2010 | Sandnas | G01K 13/028 374/163 |
| 7,915,567 B2 * | 3/2011 | Lhuillier | G01K 7/16 219/545 |
| 8,182,143 B2 | 5/2012 | Fleming et al. | |
| 8,269,513 B2 | 9/2012 | Palm et al. | |
| 8,466,390 B2 | 6/2013 | Gaertner, II et al. | |
| 8,711,008 B2 | 4/2014 | Cook et al. | |
| 8,890,703 B2 | 11/2014 | Farris et al. | |
| 9,046,899 B2 | 6/2015 | Shearer et al. | |
| 9,080,917 B2 | 7/2015 | Nguyen et al. | |
| 9,463,879 B2 | 10/2016 | Khozikov et al. | |
| 9,654,054 B1 | 5/2017 | Omoumi et al. | |
| 9,885,761 B2 | 2/2018 | Schram | |
| 9,919,812 B2 * | 3/2018 | Shi | B64D 15/12 |
| 9,927,480 B2 | 3/2018 | Nesnidal | |
| 9,939,459 B2 | 4/2018 | Dichek | |
| 10,132,824 B2 * | 11/2018 | Benning | B64D 15/20 |
| 10,151,785 B2 | 12/2018 | Essawy et al. | |
| 10,180,449 B2 | 1/2019 | Essawy et al. | |
| 10,197,517 B2 | 2/2019 | Essawy et al. | |
| 10,564,203 B2 | 2/2020 | Essawy et al. | |
| 10,895,592 B2 | 1/2021 | Essawy et al. | |
| 10,914,777 B2 | 2/2021 | Essawy et al. | |
| 10,962,580 B2 | 3/2021 | Essawy et al. | |
| 11,060,992 B2 | 7/2021 | Fok et al. | |
| 11,061,080 B2 | 7/2021 | Essawy et al. | |
| 11,117,670 B2 | 9/2021 | Shi | |
| 11,293,995 B2 | 4/2022 | Essawy et al. | |
| 2002/0078752 A1 | 6/2002 | Braunling et al. | |
| 2003/0169031 A1 | 9/2003 | Viola | |
| 2003/0206111 A1 | 11/2003 | Gao et al. | |
| 2004/0024538 A1 * | 2/2004 | Severson | B64D 15/22 702/24 |
| 2004/0075567 A1 | 4/2004 | Peck et al. | |
| 2004/0124358 A1 | 7/2004 | Okamura et al. | |
| 2004/0217106 A1 * | 11/2004 | Giterman | H05B 1/0236 219/486 |
| 2005/0231153 A1 | 10/2005 | Dewey et al. | |
| 2005/0232331 A1 * | 10/2005 | Severson | G01K 13/02 374/E13.006 |
| 2005/0232332 A1 | 10/2005 | Hanson et al. | |
| 2006/0096971 A1 | 5/2006 | Reusche et al. | |
| 2006/0133447 A1 * | 6/2006 | Severson | G01K 13/028 374/16 |
| 2006/0250143 A1 | 11/2006 | Moon et al. | |
| 2007/0084857 A1 | 4/2007 | Osaka | |
| 2007/0125764 A1 | 6/2007 | Knoeppel et al. | |
| 2007/0208520 A1 | 9/2007 | Zhang et al. | |
| 2008/0018340 A1 | 1/2008 | Arnou et al. | |
| 2008/0147255 A1 * | 6/2008 | Alwin | B64D 43/02 701/14 |
| 2008/0151963 A1 * | 6/2008 | Sandnas | G01K 13/028 374/142 |
| 2008/0183404 A1 | 7/2008 | Emami et al. | |
| 2008/0250796 A1 | 10/2008 | Clugston et al. | |
| 2009/0003408 A1 * | 1/2009 | Severson | G08B 19/02 73/29.05 |
| 2009/0065502 A1 | 3/2009 | Suenaga et al. | |
| 2009/0321415 A1 | 12/2009 | Zhang et al. | |
| 2010/0108662 A1 | 5/2010 | Taylor et al. | |
| 2011/0058397 A1 | 3/2011 | Rizzo | |
| 2011/0106475 A1 * | 5/2011 | Wigen | G01K 13/02 702/99 |
| 2011/0118990 A1 | 5/2011 | Sidhu et al. | |
| 2011/0290784 A1 | 12/2011 | Orawetz et al. | |
| 2011/0320139 A1 | 12/2011 | Amir et al. | |
| 2012/0133384 A1 | 5/2012 | Palais et al. | |
| 2012/0213246 A1 | 8/2012 | Honbo et al. | |
| 2012/0268074 A1 | 10/2012 | Cooley et al. | |
| 2012/0319706 A1 | 12/2012 | Nadel et al. | |
| 2013/0037535 A1 | 2/2013 | Ogasawara | |
| 2013/0039565 A1 | 2/2013 | Takeshima et al. | |
| 2014/0033175 A1 | 1/2014 | Lee et al. | |
| 2014/0103938 A1 | 4/2014 | Jones | |
| 2014/0245830 A1 | 9/2014 | Martin et al. | |
| 2014/0331751 A1 | 11/2014 | Macdonald | |
| 2015/0014303 A1 | 1/2015 | Kohler et al. | |
| 2015/0042980 A1 | 2/2015 | Liu et al. | |
| 2015/0055940 A1 | 2/2015 | Steinhauser | |
| 2015/0104888 A1 | 4/2015 | Lee | |
| 2015/0142343 A1 | 5/2015 | Zach et al. | |
| 2015/0160148 A1 | 6/2015 | Stanley | |
| 2015/0237680 A1 | 8/2015 | Ono et al. | |
| 2016/0013169 A1 | 1/2016 | Standing | |
| 2016/0054233 A1 | 2/2016 | Bense et al. | |
| 2016/0084986 A1 | 3/2016 | Zach et al. | |
| 2016/0131690 A1 | 5/2016 | Ueno et al. | |
| 2016/0131691 A1 * | 5/2016 | Nesnidal | H05B 3/56 324/543 |
| 2016/0178680 A1 | 6/2016 | Ntziachristos | |
| 2016/0255184 A1 | 9/2016 | Hwang | |
| 2016/0280391 A1 * | 9/2016 | Golly | G01L 19/0092 |
| 2016/0291051 A1 | 10/2016 | Golly et al. | |
| 2016/0313259 A1 | 10/2016 | Shayovitz | |
| 2016/0338569 A1 | 11/2016 | Reder et al. | |
| 2016/0364629 A1 | 12/2016 | Solli | |
| 2016/0377487 A1 | 12/2016 | Cheung et al. | |

(56) References Cited

U.S. PATENT DOCUMENTS

| | | | |
|---|---|---|---|
| 2017/0037090 | A1 | 2/2017 | Richmond et al. |
| 2017/0047821 | A1 | 2/2017 | Klassen |
| 2017/0110887 | A1 | 4/2017 | Bell et al. |
| 2017/0115139 | A1* | 4/2017 | Wong ................. H05B 3/56 |
| 2017/0191875 | A1 | 7/2017 | Schmidt et al. |
| 2017/0259927 | A1 | 9/2017 | Schram |
| 2017/0273142 | A1* | 9/2017 | Denis ................. H05B 1/0236 |
| 2017/0299626 | A1 | 10/2017 | Dichek |
| 2017/0336156 | A1 | 11/2017 | Phillips |
| 2017/0343418 | A1 | 11/2017 | Hurbi et al. |
| 2017/0370748 | A1 | 12/2017 | Fuller |
| 2017/0370960 | A1* | 12/2017 | Benning ............. G01K 13/028 |
| 2017/0374296 | A1 | 12/2017 | Schmidt |
| 2018/0037338 | A1* | 2/2018 | Shi ..................... G01R 31/008 |
| 2018/0183404 | A1 | 6/2018 | Jourdan et al. |
| 2018/0197350 | A1* | 7/2018 | Kim ................... G05B 23/0283 |
| 2018/0275080 | A1 | 9/2018 | Essawy et al. |
| 2018/0275085 | A1 | 9/2018 | Fok et al. |
| 2018/0275181 | A1 | 9/2018 | Essawy et al. |
| 2018/0275182 | A1 | 9/2018 | Essawy et al. |
| 2018/0275183 | A1 | 9/2018 | Essawy et al. |
| 2018/0275184 | A1 | 9/2018 | Essawy et al. |
| 2018/0275185 | A1 | 9/2018 | Essawy et al. |
| 2019/0382139 | A1* | 12/2019 | Shi ..................... B64D 43/02 |
| 2020/0063682 | A1* | 2/2020 | Boelke ................ B64D 15/12 |
| 2020/0191850 | A1 | 6/2020 | Essawy et al. |
| 2020/0191851 | A1 | 6/2020 | Essawy et al. |
| 2020/0340889 | A1* | 10/2020 | Mlcak ................ G01N 29/022 |
| 2020/0391871 | A1 | 12/2020 | Essawy et al. |

FOREIGN PATENT DOCUMENTS

| | | | |
|---|---|---|---|
| CN | 104296957 | A * | 1/2015 |
| CN | 105092050 | A | 11/2015 |
| CN | 109246868 | A | 1/2019 |
| CN | 109521252 | A | 3/2019 |
| EP | 1441429 | A1 | 7/2004 |
| EP | 2755443 | A2 | 7/2014 |
| EP | 3018057 | A1 | 5/2016 |
| EP | 3281874 | A1 | 2/2018 |
| EP | 3379265 | A1 | 9/2018 |
| EP | 3745141 | A1 | 12/2020 |
| GB | 809608 | | 2/1959 |
| GB | 8884415 | | 12/1961 |
| JP | 2006088391 | A | 4/2006 |
| JP | 20121968123 | A | 10/2012 |
| KR | 20110124542 | A | 11/2011 |
| KR | 101110789 | B1 | 2/2012 |
| KR | 20120062301 | A | 6/2012 |
| WO | 09011532 | A1 | 10/1990 |
| WO | 09816837 | A1 | 4/1998 |
| WO | 9943066 | A1 | 8/1999 |
| WO | 2011026740 | A1 | 3/2011 |

OTHER PUBLICATIONS

Extended European Search Report for European Patent Application No. 18153822.4, dated May 17, 2018, 9 pages.
Communication Pursuant to Article 94(3) EPC for European Patent Application No. 18153822.4, dated Jan. 16, 2020, 4 pages.
Extended European Search Report for European Patent Application No. 18153825.7, dated Apr. 9, 2018, 7 pages.
Extended European Search Report for European Patent Application No. 19207401.1, dated Jan. 27, 2020, 8 pages.
Extended European Search Report for European Patent Application No. 18153830.7, dated May 23, 2018, 9 pages.
Extended European Search Report for European Patent Application No. 18153832.3, dated May 24, 2018, 9 pages.
Extended European Search Report for European Patent Application No. 19205621.6, dated Nov. 22, 2019, 9 pages.
Extended European Search Report for European Patent Application No. 18153834.9, dated May 29, 2018, 9 pages.
Extended European Search Report for European Patent Application No. 19203208.4, dated Nov. 18, 2019, 7 pages.
Extended European Search Report for European Patent Application No. 18153824.0, dated May 17, 2018, 9 pages.
Communication Pursuant to Article 94(3) EPC for European Patent Application No. 18153824.0, dated Jun. 12, 2019, 7 pages.
Communication Pursuant to Article 94(3) EPC for European Patent Application No. 18153824.0, dated Jan. 16, 2020, 5 pages.
Extended European Search Report for European Patent Application No. 18162251.5, dated Jul. 5, 2018, 9 pages.
Communication Pursuant to Article 94(3) EPC for European Patent Application No. 18162251.5, dated Jun. 12, 2019, 3 pages.
Cedric Gillet and Andreas Freidrich, "Guidelines for Designing a Concentrator for High-Current Sensing Applications with an Allegro Hall-Effect Sensor IC", 2013, 7 pages.
Magnetics Division of Sprang & Company, Technical Bulletin "Magnetic Cores for Hall Effect Devices", 1997, 6 pages.
Extended European Search Report dated Jul. 26, 2021, received for corresponding European Application No. 21164413.3, eight pages.
Extended European Search Report dated Sep. 1, 2021 for corresponding European Application No. 21169946.7, seven pages.
Extended European Search Report for European Patent Application No. 19213783.4, dated Jun. 23, 2020, 7 pages.
Extended European Search Report for European Patent Application No. 19216276.6, dated Jul. 6, 2020, 10 pages.
P. Lu et al., "Real-Time Monitoring of Temperature Rises of Energized Transformer Cores With Distributed Optical Fiber Sensors," in IEEE Transactions on Power Delivery, vol. 34, No. 4, pp. 1588-1598, Aug. 2019, doi: 10.1109/TPWRD.2019.2912866.
L. Chen, G. R. Nagendra, J. T. Boys and G. A. Covic, "Double-Coupled Systems for IPT Roadway Applications," in IEEE Journal of Emerging and Selected Topics in Power Electronics, vol. 3, No. 1, pp. 37-49, Mar. 2015, doi 10.1109/JESTPE.2014.2325943.
J. M. Miller and A. Daga, "Elements of Wireless Power Transfer Essential to High Power Charging of Heavy Duty Vehicles," in IEEE Transactions on Transportation Electrification, vol. 1, No. 1, pp. 26-39, Jun. 2015, doi: 10.1109/TTE.2015.2426500.
A. Trigui et al., "Generic Wireless Power Transfer and Data Communication System Based on a Novel Modulation Technique," in IEEE Transactions on Circuits and Systems I: Regular Papers, vol. 67, No. 11, pp. 3978-3990, Nov. 2020, doi: 10.1109/TCSI.2020.3010308.

* cited by examiner

HEALTH MONITORING OF AN ELECTRICAL HEATER OF AN AIR DATA PROBE

CROSS-REFERENCE TO RELATED APPLICATION(S)

This application is related to U.S. patent application Ser. No. 16/220,850, entitled "REAL TIME OPERATIONAL LEAKAGE CURRENT MEASUREMENT FOR PROBE HEATER PHM AND PREDICTION OF REMAINING USEFUL LIFE", filed Dec. 14, 2018. This application is also related to U.S. patent application Ser. No. 16/425,695, entitled "DIFFERENTIAL LEAKAGE CURRENT MEASUREMENT FOR HEATER HEALTH MONITORING", filed May 29, 2019.

BACKGROUND

Air data probes such as, for example, Pitot probes and Total Air Temperature (TAT) probes measure important aircraft flight parameters. Such flight parameter measurements are used to facilitate safe operation of an aircraft in flight. The quality of such flight parameter measurements can be compromised when ice accretes on exposed surfaces of the air data probes. Such ice accretion can plug the probe pneumatic tubing and deleteriously affect the measurement quality of the measured flight parameters. Air data probes have been equipped with electrical heaters so as to provide deicing capability to the air data probes thus equipped.

The abrupt failure of such electrical heaters can result in a sudden loss of the air data probe's functionality, which might lead to undesirable flight control consequences. Gradual degradation in the quality of measurement can also lead to suboptimal flight consequences. Such electric heater can fail or degrade for various reasons. For example, electrical heaters can fail suddenly due a resistive heating element cracking open, or the resistive heating element short circuiting to a nearby conductive member. Such short circuiting can occur when insulation between the resistive heating element and the conductive member degrades, which can compromise the heater function.

If such insulation cracks, oxygen, dust, carbon, oils, and other contaminants can traverse the insulation so as to be present at the surface of the resistive heating element. Such contaminants, especially when combined with humidity and high temperature can cause the resistive heating element and surrounding insulation to oxidize. Oxidation of the resistive heating element and the surrounding insulation can increase the electrical resistance thereof, which can lead to open circuit failure. Oxidation of the surrounding insulation can cause the insulation to become brittle and/or crack, which can reduce the electrical resistance thereof leading short circuit failure. Both short circuit failure and open circuit failure can result in loss of heater function, thereby leaving the air data probe susceptible to ice accretion and blockage of probe pneumatic tubing.

SUMMARY

Apparatus and associated methods relate to a system for monitoring health of an electrical heater of an air data probe. The system includes an electrical power source configured to electrically couple to the electrical heater so as to provide electrical power thereto. The system includes an aircraft interface configured to communicate with an aircraft so as to receive aircraft flight parameters and/or environmental conditions therefrom. The system includes an electrical-property calculator configured to calculate an expected value of an electrical property of the electrical heater based in part on the provided electrical power and further based in part on the aircraft flight parameters and/or environmental conditions. The system includes an electrical measurement circuit configured to electrically couple to the electrical heater so as to measure electrical parameters indicative of the electrical property of the electrical heater. The system also includes a health monitor configured to determine health of the electrical heater based on a comparison between the calculated expected value and the electrical property as indicated by the measured electrical parameters.

Some embodiments relate to a method for monitoring health of an electrical heater of an air data probe. The method includes providing, via an electrical power source electrically coupled to the electrical heater, electrical power thereto. The method incudes receiving, via an aircraft interface in communication with an aircraft, aircraft flight parameters and/or environmental conditions therefrom. The method includes calculating, via an electrical-property calculator, an expected value of an electrical property of the electrical heater based in part on the provided electrical power and further based in part on the aircraft flight parameters and/or environmental conditions. The method includes measuring, via an electrical measurement circuit electrically coupled to the electrical heater, electrical parameters indicative of the electrical property of the electrical heater. The method also includes determining, via a health monitor, health of the electrical heater based on a comparison between the calculated expected value and the electrical property as indicated by the measured electrical parameters.

DETAILED DESCRIPTION

Apparatus and associated methods relate to determining health of an electrical heater of an air data probe based on a comparison between a calculated expected value and a measured value of an electrical property of the electrical heater. The expected value of the electrical property is calculated based in part on the electrical power provided to the electrical heater and further based in part on the aircraft flight parameters and/or environmental conditions. Such aircraft flight parameters and/or environmental conditions can include at least one of: electric power source status, airspeed, air pressure, altitude, air temperature, humidity, liquid water content, ice water content, droplet/particle size distribution, angle of attack, and angle of sideslip. These aircraft flight parameters and/or environmental conditions are received via an aircraft interface.

Figure 1:
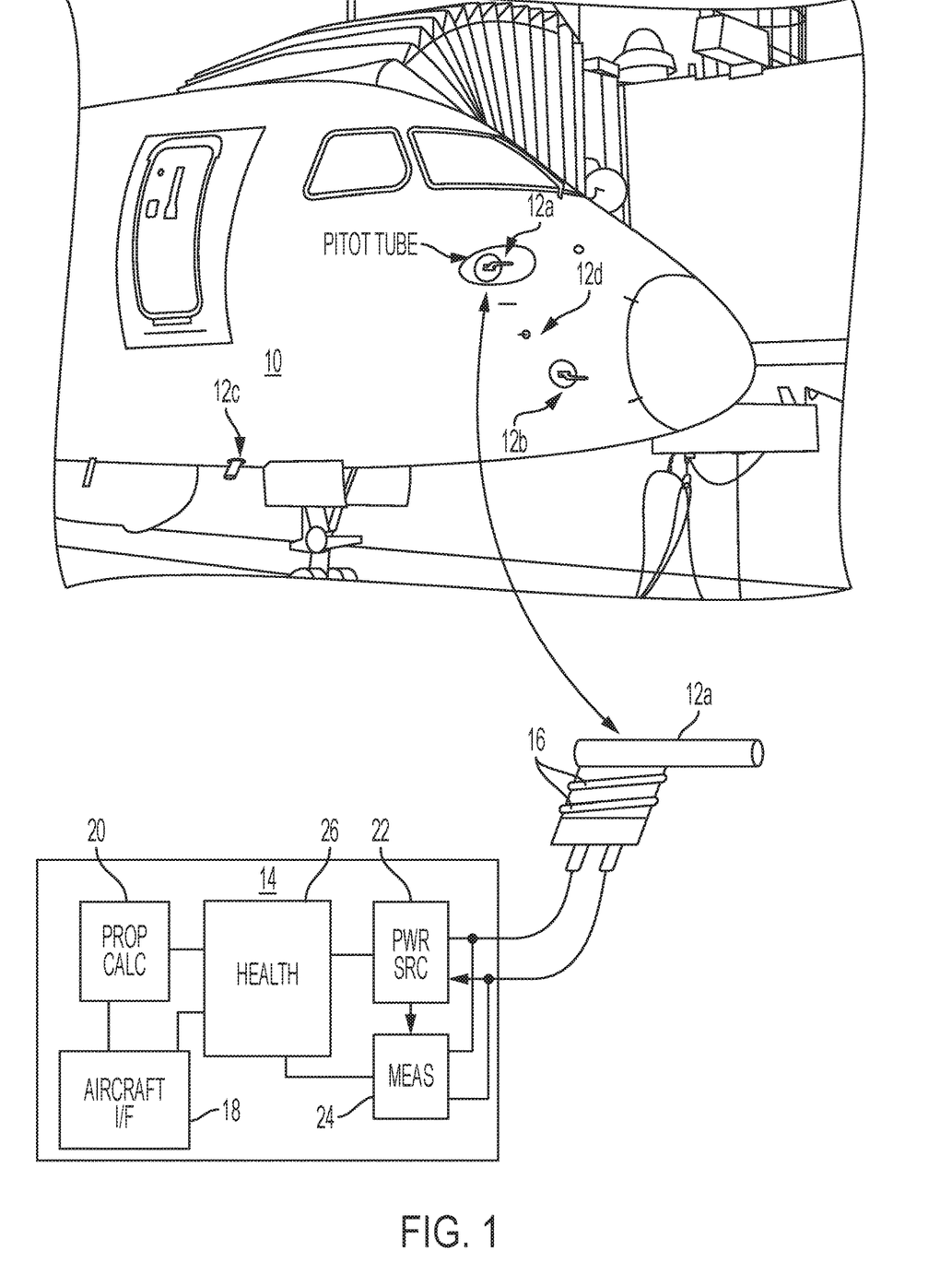
FIG. 1 is a diagram illustrating an aircraft equipped air data probes and a probe control/monitor system.

FIG. 1 is a diagram illustrating an aircraft equipped with air data probes and a probe control/monitor system. In FIG. 1, aircraft 10 includes air data probes 12a-12d and probe control/monitor system 14. Air data probes 12a-12d can be any of a variety of probes that measure various parameters used during flight operations, such as, for example, airspeed, static air pressure, ram pressure, static air temperature, altitude, etc. As such, air data probes 12-12d are often externally affixed to aircraft 10 so as to be exposed to the external atmospheric environment, thus making them susceptible to ice accretion thereon. Each of air data probes 12a-12d is in communication with a probe control/monitor system, such as probe control/monitor system 14. In some embodiments, probe control/monitor system 14 is in communication with a plurality of air data sensors, such as, for example, air data sensors 12a-12d. In some embodiments, probe control/monitor system 14 can be located in an avionics bay of aircraft 10.

In the depicted embodiment, air data probe 12a is a pitot tube, which is configured to measure ram pressure. Air data probe 12a is equipped with electrical heater 16 so as to prevent ice accretion on surfaces of air data probe 12a. Electrical heater 16 can have a resistive heating element that is thermally coupled to but electrically isolated from a conductive member of air data probe 12a. For example, electrical heater 16 can be coaxial, such that an insulative member is proximate to and coaxial with a resistive heating element, and a conductive shield can be proximate to and coaxial with the insulative member. Health of electrical heater 16 can be determined based on electrical resistance of the resistive heating element and/or leakage current between the resistive heating element and the conductive member of air data probe 12a, for example. Both electrical resistance of the resistive heating element and leakage current between the resistive heating element and the conductive member of air data probe 12a, however, can change in response to the thermal load of electrical heater 16. The thermal load of electrical heater 16, in turn, can depend upon aircraft flight parameters and/or environmental conditions.

Probe control/monitor system 14 is configured to provide electrical power to electrical heater 16 and to measure electrical parameters of electrical heater 16. In the depicted embodiment, probe control/monitor system 14 is shown in electrical communication with electrical heater 16 of air data probe 12a. Probe control/monitor system 14 includes aircraft interface 18, electrical-property calculator 20, electrical power source 22, measurement circuit 24, and health monitor 26. Power source 22 can provide electrical power to electrical heater 16 in various ways. For example, power source 22 can provide a constant voltage to electrical heater 16. In some embodiments, power source 22 can maintain constant power provided to electrical heater 16. In some embodiments, power source 22 can control the electrical power provided to electrical heater 16 based, at least in part, on aircraft flight parameters and/or environmental conditions, which are transmitted by aircraft 10 and received by probe control/monitor system 14 via aircraft interface 18. Such power control based on aircraft flight parameters and/or environmental conditions can be performed so as to provide power that will result in heating of air data probe 12a to a target temperature, for example.

In some embodiments, electrical-property calculator 20 can estimate one or more local flowfield property, based on the received aircraft flight parameters and/or environmental conditions. The local flowfield property can be different, sometimes substantially different, from the corresponding freestream property. For example, the local (e.g., in the immediate vicinity of an air data probe) airspeed can be substantially different from the freestream airspeed. The estimated local flowfield property or properties can then be used in subsequent calculations, such as those described below.

Various electrical properties of electrical heater 16 can vary in response to either the electrical power provided to electrical heater 16 or the thermal load thereupon. Thus, electrical-property calculator 20 can be configured to calculate an expected value of an electrical property of the electrical heater based in part on the electrical power that is or will be provided to electrical heater 16 and further based in part on the received aircraft flight parameters and/or environmental conditions, which can be indicative of the thermal load upon electrical heater 16. In some embodiments, the calculated expected value of an electrical parameter is based on one or more estimated local flowfield properties, such as airspeed, air pressure, water content, air temperature, etc. If electrical heater 16 behaves as expected, the actual electrical property of electrical heater 16 should be approximately equal (e.g., within 2%, 3%, 5%, 10%, 15%, 25% etc.) to the expected value calculated by electrical-property calculator 20.

In some embodiments, electrical-parameter calculator 20 can be further configured to calculate the thermal load of electrical heater 16 based on the received flight parameters and/or environmental conditions. Such a thermal load calculation can be used in the calculation of the expected value of the electrical property of electrical heater 16 and/or used in a calculation of a target value of electrical power to be provided to electrical heater 16. Electrical-property calculator can calculate the target value of electrical power so as to ensure that air data probe 12a is heated to a target temperature, for example. Such a target temperature may be selected so as to prevent ice accretion on exposed surfaces of air data probe 12a.

Measurement circuit 24 is configured to measure electrical parameters indicative of the electrical property of electrical heater 16 corresponding to the expected value calculated by electrical-property calculator 20. If the calculated value corresponds to a measure of a resistance of the resistive heating element, then measurement circuit 24 would be configured to measure electrical parameters indicative of the actual resistance of the resistive heating element (e.g., current through and voltage across the resistive heating element). If the calculated value corresponds to a leakage current between the resistive heating element and the conductive member of air data probe 12a, then measurement circuit 24 would be configured to measure electrical parameters indicative of the actual leakage current between the resistive heating element and the conductive member of air data probe 12a (e.g., first and second currents through the resistive heating element at first and second ends, respectively, of the resistive heating element so as to obtain a current difference).

Health monitor 26 can then assess the health of electrical heater 16. In some embodiments, health monitor 26 is configured to determine health of electrical heater 16 based on a comparison between the calculated expected value and the actual electrical property as indicated by the measured electrical parameters. For example, health monitor 26 can compare electrical resistance of the resistive heating element as determined from electrical parameters measured by probe control/monitor system 14 with an expected value as determined by electrical-property calculator 20. In some embodiments, electrical-property calculator 20 can determine an electrical-resistance threshold based on the calculated expected value. For example, the electrical-resistance threshold can be a factor (e.g., 1.1, 1.2, 1.25, 1.5, 2.0, etc.) times the calculated expected value for the particular flight parameters and/or environmental conditions.

In some embodiments, electrical-property calculator 20 can determine the electrical-resistance threshold based on a historical trend of measured electrical resistance values. For example, the electrical-resistance threshold can be a factor times the measured electrical resistance of the resistive heating element at the time of installation or at a time of calibration. In some embodiments, electrical-property calculator 20 can determine the electrical-resistance threshold based on various combinations of such methods. For example, the electrical-resistance threshold can be a factor times a calculated normal value for the particular flight parameters and/or environmental conditions, based on the measured electrical resistance of the resistive heating element at the time of installation or calibration.

Health monitor 26 can then assess the health of electrical heater 16 based on the comparison of the electrical-resistance threshold and the actual electrical resistance as determined based on the measured electrical parameters. If the electrical resistance exceeds the electrical-resistance threshold, for example, health monitor 26 can generate an alert signal and transmit the generated alert signal to a cockpit interface so as to alert the pilot. Such an alert signal can be transmitted to the cockpit interface via the aircraft interface, for example. The data can also be sent to a ground station so as to provide an alert for the need to repair/replace air data probe 10 based on the prognostics and health monitoring algorithms. This condition based maintenance system can facilitate the proactive replacement and/or repair of the compromise probe so as to avoid sudden unpredictable failures that lead to flight delays and operations interruptions. Such proactive maintenance can result is significant cost savings to an airline company.

In some embodiments, health monitor 26 can compare leakage current between the resistive heating element and the conductive member of air data probe 12a as determined from electrical parameters measured by probe control/monitor system 14 with a leakage-current threshold as determined by electrical-property calculator 20. In some embodiments, electrical-property calculator 20 can determine the leakage-current threshold based on the calculated normal value. For example, the leakage-current threshold can be a factor (e.g., 1.5, 2.0, 3.0, 5.0, 10.0, etc.) times the calculated normal value for the particular flight parameters and/or environmental conditions.

In some embodiments, electrical-property calculator 20 can determine the leakage-current threshold based on a historical trend of measured electrical resistance values. For example, the leakage-current threshold can be a factor times the measured leakage current between the resistive heating element and the conductive member of air data probe 12a at the time of installation. In some embodiments, electrical-property calculator 20 can determine the leakage-current threshold based on various combinations of such methods. For example, the leakage-current threshold can be a factor times a calculated normal value for the particular flight parameters and/or environmental conditions, based on the measured leakage current between the resistive heating element and the conductive member of air data probe 12a at the time of installation.

Health monitor 26 can then assess the health of electrical heater 16 based on the comparison of the leakage-current threshold and the actual leakage current as determined based on the measured electrical parameters. If the actual leakage current exceeds the leakage-current threshold, for example, health monitor 26 can generate an alert signal and transmit the generated alert signal to a cockpit interface so as to alert the pilot. Such an alert signal can be transmitted to the cockpit interface via the aircraft interface, for example.

Figure 2A:
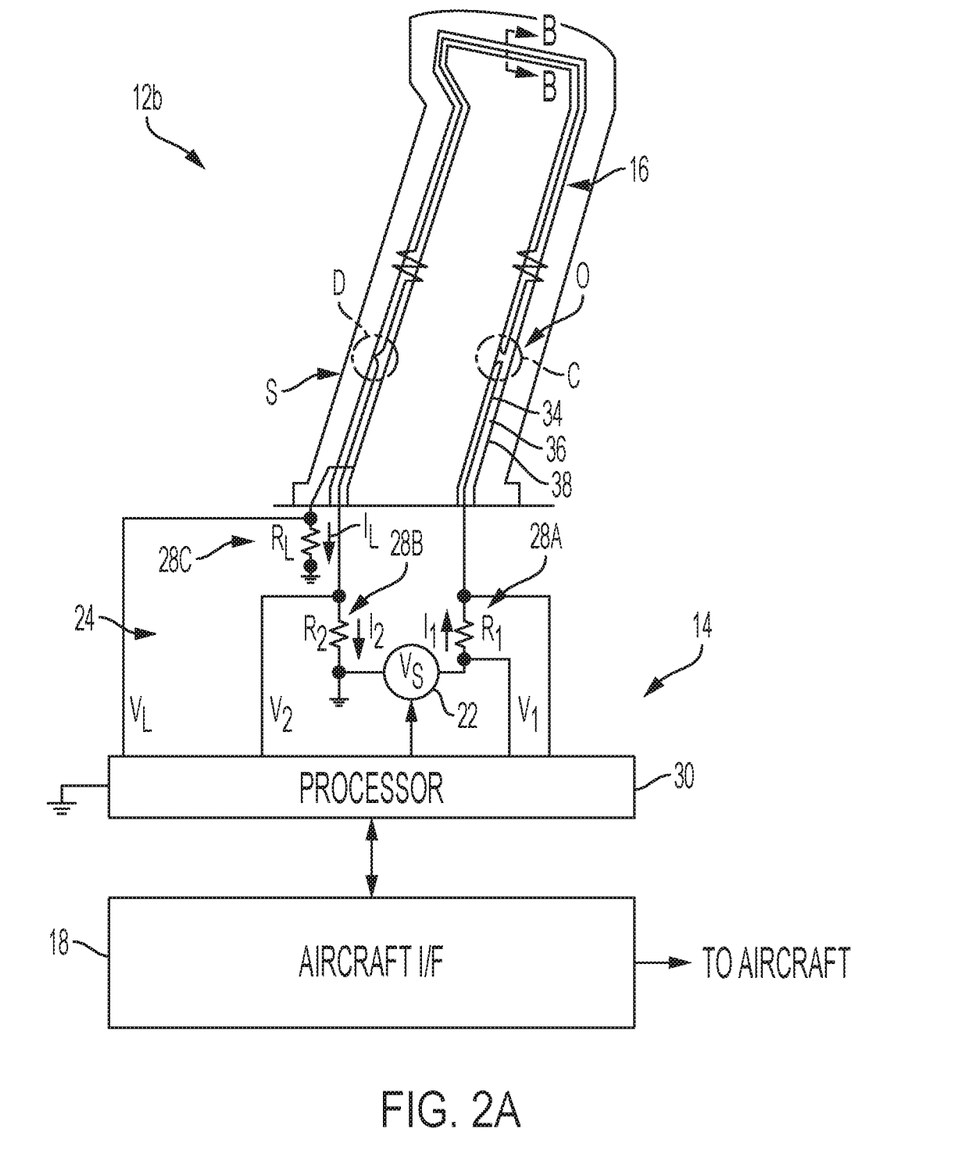
FIG. 2A is a block diagram of an air data probe control system that includes a temperature control system and a health monitor.
Figure 2B:
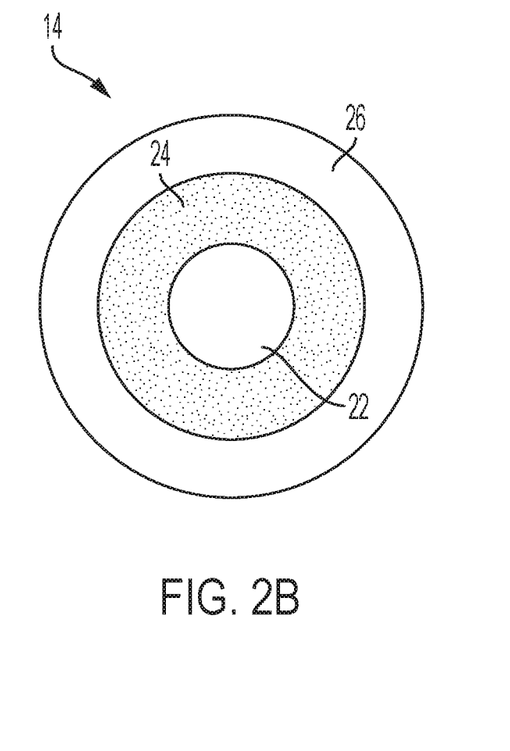
FIGS. 2B-2D are cross-sectional views of normal and abnormal sections of the electrical heater depicted in FIG. 2A taken along line B-B of FIG. 2A.
Figure 2C:
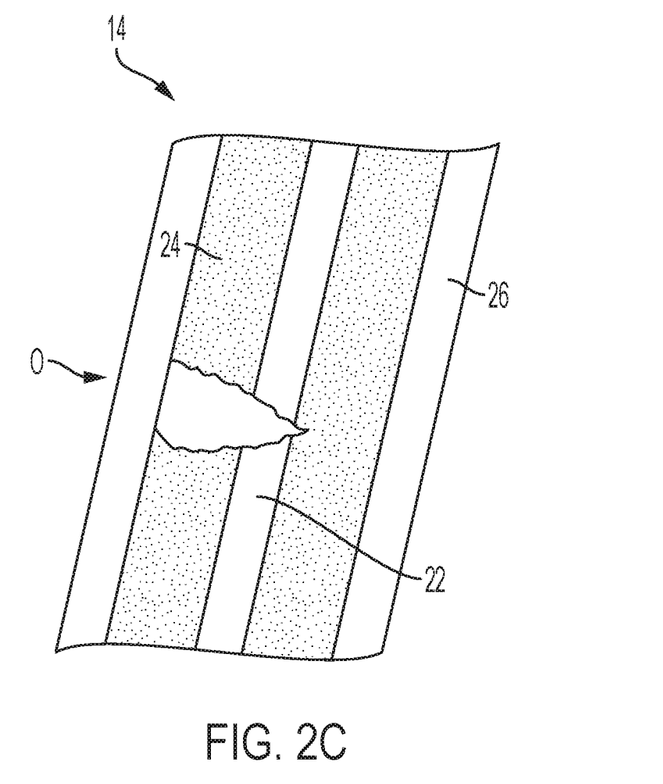
Figure 2D:
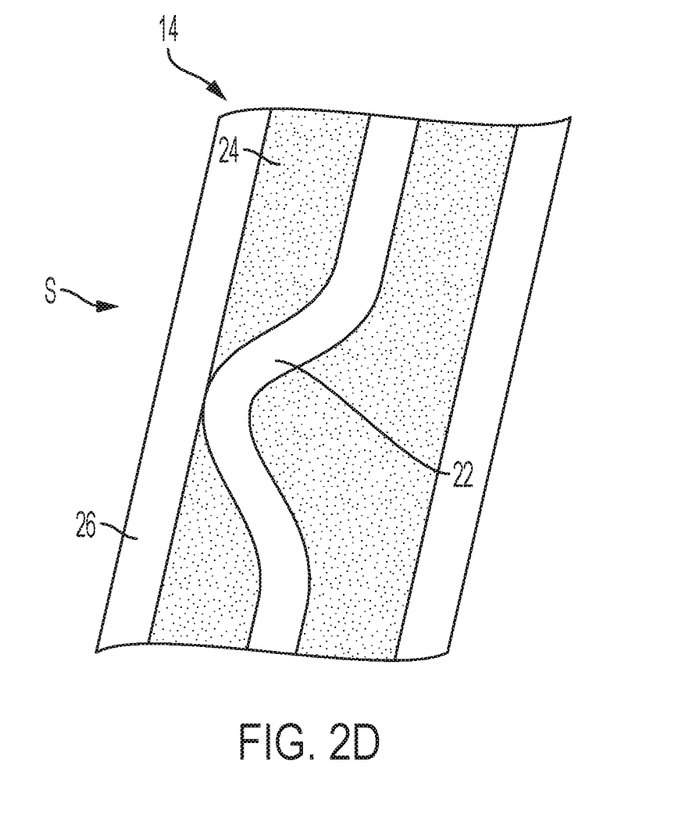

Next, with reference to FIGS. 2A-2D various failure mechanisms and failure detection methods of electrical heater 16 will be shown. FIG. 2A is a diagram of air data probe 12a that includes electrical heater 16 and probe control/monitor system 14 that is electrically connected to electrical heater 16. While illustrated in FIG. 2A as a TAT probe, air data probe 12b may be any other type of air data probe 12a-12d or sensing element. FIG. 2B is a cross-sectional view of electrical heater 16 of air data probe 12b taken along line B-B of FIG. 2A. FIG. 2C is a partial cross-sectional view illustrating open circuit O in electrical heater 16. FIG. 2D is a partial cross-sectional view illustrating short circuit S in electrical heater 16. FIGS. 2A, 2B, 2C, and 2D will be discussed together.

Air data probe 12b is an aircraft component and includes electrical heater 16. Air data probe 12b is electrically connected to probe control/monitor system 14, which includes aircraft interface 18, electrical power source 22, electrical measurement circuit 24, and processor 30. Aircraft interface 18 is in communication with the aircraft 10 (depicted in FIG. 1) so as to receive flight parameters and/or environmental conditions therefrom. Electrical measurement circuit 24 includes first sensing resistor 28A, second sensing resistor 28B, and leakage sensing resistor 28C. Electrical heater 16 includes resistive heating element 34, insulative member 36, and conductive shield 38.

Electrical heater 16 is depicted as routed through air data probe 12b along a path and is electrically connected to probe control/monitor system 14 within aircraft 10. Electrical heater 16 receives power (e.g., in the form of a controlled voltage $V_S$) from voltage source 22 of probe control/monitor system 14 so as to provide heating of air data probe 12b. Voltage source 22 can provide direct current (DC) power or alternating current (AC) power to electrical heater 16 depending on the type of air data probe 12b to which electrical heater 16 is thermally coupled. First electrical current $I_1$ is electrical current that flows through resistive heating element 36 at a first end of electrical heater 16. Second electrical current $I_2$ is electrical current that flows through resistive heating element 36 at a second end opposite the first end of electrical heater 16. For example, as seen in FIG. 2A, first electrical current $I_1$ (which can be DC or AC current) flows into electrical heater 16, and second electrical current $I_2$ (which can be DC or AC current) flows out of electrical heater 16. First current $I_1$ flows through first sensing resistor 28A to produce a sensed voltage, or first sensor signal $V_1$. In the depicted embodiment, first sensing resistor 28A has a first resistance $R_1$. Second electrical current $I_2$ flows through second sensing resistor 28B to produce a sensed voltage, or second sensor signal $V_2$. In the depicted embodiment, second sensing resistor 28B has a second resistance $R_2$. Leakage current $I_L$ is electrical current that flows between resistive heating element 36 and conductive shield 38. Conductive shield 38 has been biased to electrical ground via resistive leakage sensing resistor 28C. Leakage current $I_L$ flows through leakage sensing resistor 28C so as to produce a sensed voltage, or leakage sensor signal $V_L$. In the depicted embodiment, leakage sensing resistor 28C has a leakage resistance $R_L$. Because first resistance $R_1$, second resistance $R_2$, and leakage resistance $R_L$ can have known values. First sensor voltage $V_1$, second sensor voltage $V_2$, and leakage sensor voltage $V_L$ are indicative of first current $I_1$, second current $I_2$, and leakage current $I_L$, respectively. First sensor voltage $V_1$, second sensor voltage $V_2$, and leakage sensor voltage $V_L$, which are indicative of first current $I_1$, second current $I_2$, and leakage current $I_L$, respectively, can vary as a function of aging of air data probe 12b, as well as of flight parameters and/or environmental conditions.

In alternate embodiments, the functions performed by first sensor 28A, second sensor 28B, and leakage sensor 28C can be performed in various other manners. For example, first and second currents $I_1$ and $I_2$ can be sensed via a current transformer. In some embodiments a current transformer can be configured to measure a difference between the first and second current $I_2$-$I_1$ so as to provide a signal that is indicative of the leakage current through the heater insulation.

Processor 30 is electrically connected to both electrical measurement circuit 22 and electrical power source 24. First sensor voltage $V_1$, second sensor voltage $V_2$, and leakage sensor voltage $V_L$ are provided to processor 30 by electrical measurement circuit 22. Based on first sensor voltage $V_1$, second sensor voltage $V_2$, and/or leakage sensor voltage $V_L$, in addition to the heater supply voltage $V_S$, processor 30 can determine both electrical resistance of resistive heating element 34 and leakage current between resistive heating element 34 and conductive shield 36 of air data probe 12b. For example, processor can determine electrical resistance of resistive heating element 34 by dividing heater supply voltage $V_S$ by either first current $I_1$ second current $I_2$, or average of first and second currents $(I_1+I_2)/2$, among other ways known to persons skilled in the art. Processor can determine leakage current between resistive heating element 34 and conductive shield 36 by dividing leakage sensor voltage $V_L$ by leakage resistance $R_L$, or by measuring the difference between first current $I_1$ and second current $I_2$, for example.

In the depicted embodiment, processor 30 is also electrically connected to aircraft interface 18, from which flight parameters and/or environmental conditions are transmitted. Processor 30 can also transmit signals indicative of health of electrical heater 16 to aircraft 10 via aircraft interface 18. Examples of such signals include signals indicative of status of electrical heater 16, such as signals indicating: OK, ANTICIPATED OPEN, ANTICIPATED SHORT, and/or FUTURE FAILURE/REMAINING USEFUL LIFE.

As seen in FIG. 2B, electrical heater 16 has resistive heating element 34, which conducts first current $I_1$ at the first end and conducts second $I_2$ at the second end. Resistive heating element 34 can be made of oxidation resistant material such as Nichrome, or any other suitable material. Insulative member 36 surrounds resistive heating element 34 or can be interposed between resistive heating element 34 and conductive member 38 of air data sensor 12b. Insulative member 36 can be made of silica, ceramic, or any other suitable insulating material. Conductive member 38 can be metallic and can surround insulative member 36 such that insulative member 36 is captured between resistive heating element 34 and conductive shield 38. Conductive shield 38 may be made of nickel alloy, copper alloy, or any other suitable oxidation resistant material.

Electrical heater 16 is configured to prevent ice from accreting onto surfaces of air data probe 12b when air data probe 12b is exposed to atmospheric conditions conducive to such ice accretion, such as, for example, cold temperatures when flying at high altitudes. Voltage source $V_S$ is configured to supply electrical power to resistive heating element 34 such that first current $I_1$ is provided to and driven through resistive heating element 34, producing the required heat for air data probe 12b, and second current $I_2$ flows out of resistive heating element 34.

Insulative member 36 protects resistive heating element 34 and electrically insulates resistive heating element 34. For example, resistive heating element 34 can be electrically insulated from metallic conductive shield 38 by insulative member 36. Conductive shield 38 is configured to provide electrostatic shielding of resistive heating element 34. Conductive shield 38 is further configured to provide mechanical protection of both insulative member 36 and resistive heating element 34, such as by keeping moisture and contaminants from compromising electrical heater 16.

If conductive shield 38 were to crack, oxygen, moisture, dust, carbon, oils, and other contaminants could leak through conductive shield 38 to insulative member 36, and then to resistive heating element 34, thereby causing the material of insulative member 36 and resistive heating element 34 to oxidize, change properties, and/or otherwise break down. Loss of function of insulative member 36 can lead to resistive heating element 34 shorting to conductive shield 38, as indicated by short circuit S. Cracking and deterioration of resistive heating element 34 can lead to open circuit O. For example, oxidation or cracking of insulative member 36 can lead to a gap in insulative member 36 and resistive heating element 34, or open circuit O, and loss of function of electrical heater 16, as shown in FIG. 2C. Additionally, loss of function of insulative member 36 can cause resistive heating element 34 to contact conductive shield 38, or short circuit S, and loss of function of electrical heater 16, as shown in FIG. 2D. Open circuit O and short circuit S both represent failures of electrical heater 16 as current is no longer able to flow through electrical heater 16. In early stages of open circuit O and short circuit S, intermittent electric arcing can occur as a result of electric discharge through small conductive air gaps in insulative member 36. The ionization of air in the gaps in insulative member 36 can permit electric charge to cross the gap, producing plasma that conducts electrical current through the gap and can produce visible light and/or high local temperatures (i.e., electrical arcing). As resistive heating element 34 deteriorates, such as in open circuit O, electric arcing can also occur within resistive heating element 34. In cases of short circuit S, electric arcing can occur between resistive heating element 34 and conductive shield 38. Electric arcing can lead to either temporary restoration of function of electrical heater 16 due to temporarily closing a gap in the case of open circuit O or opening a gap in the case of short circuit S. Electric arcing can also lead to complete open circuit of resistive heating element 34 or to more shorting in the insulation, depending on the mechanics or arcing and resulting conditions. Electric arcing can manifest itself as high-frequency noise in sensor signal $V_1$, second sensor signal $V_2$, and leakage sensor signal $V_L$ at a much higher frequency range than the operating frequencies. For example, electric arcing may be indicated at a range of about 50 KHz to about 200 KHz.

Processor 30 can exploit the frequency signature of arcing by sampling first sensor signal $V_1$, second sensor signal $V_2$, and leakage sensor signal $V_L$, which are indicative of first current $I_1$, second current $I_2$, and leakage current $I_L$, respectively, at a high-frequency sampling rate. The high-frequency sampling rate can be greater than two times the highest frequency of the electrical noise produced by electric arcing (which can be limited by an anti-aliasing filter), such as from about 150 KHz to about 500 KHz.

Because electric arcing is a precursor to open circuit O or short circuit S failure of electrical heater 16, prediction processor 31 determines status 21 of electrical heater 16 based on the presence of electric arcing. Electric arcing can manifest itself as a high-frequency noise in first sensor signal $V_1$, second sensor signal $V_2$, and leakage sensor signal $V_L$. Such high-frequency noise can be identified in Fourier transformed data of first sensor signal $V_1$, second sensor signal $V_2$, and leakage sensor signal $V_L$. Processor 30 can then identify the presence of electric arcing in electrical heater 16 based on detection of high-frequency noise to determine future failure of electrical heater 16.

Processor 30 can be configured to output a status of OK, indicating electrical heater 16 is functioning properly, when there is no high-frequency noise in Fourier transformed data representing first sensor signal $V_1$, second sensor signal $V_2$, leakage sensor signal $V_L$, and difference voltage $V_D$. Processor 30 can be configured to output a status of ANTICIPATED OPEN, indicating an imminent future open circuit O, when there is high-frequency noise in Fourier transformed data representing first sensor signal $V_1$ and second sensor signal $V_2$ and no increase or elevation in signal levels of leakage sensor signal $V_L$ and difference voltage $V_D$. Processor 30 can be configured to output a status of ANTICIPATED SHORT, indicating an imminent future short circuit S, when there is high-frequency noise in Fourier transformed data representing first sensor signal $V_1$ and second sensor signal $V_2$ as well as high-frequency noise in Fourier transformed data representing leakage sensor signal $V_L$, in addition to a noticeable increase or elevation in signal levels of leakage sensor signal $V_L$. Processor 30 can be configured to output a status of FUTURE FAILURE/REMAINING USEFUL LIFE, indicating the remaining useful life of electrical heater 16, based on signatures (specific shapes) and magnitudes of Fourier transformed data representing first sensor signal $V_1$, second sensor signal $V_2$, and leakage sensor signal $V_L$.

Electrical heater 16 can prevent ice accretion on surface of air data probe 12b, thereby facilitating proper functioning thereof. Electrical heater 16 can abruptly fail as a result of open circuit O or short circuit S, which causes a sudden loss of functionality of air data probe 12b. Because proper functioning of air data probe 12b is important for safe operation of aircraft 10, prognostics of electrical heater 16 can improve the reliability of air data probe 12b. Predicting future failure of electrical heater 16 can permit a user to replace electrical heater 16 when necessary (such as between flights or at another convenient time) and prevents unpredictable failures of electrical heater 16, which can reduce flight delays, improve flight safety, and lower aircraft maintenance and flight operation costs.

In the FIG. 2A embodiment, processor 30 is configured to perform the functions of both electrical-property calculator 20 and health monitor 26 of the FIG. 1 embodiment. Thus, processor 30 can be configured to calculate a thermal load of electrical heater 16 based on the received aircraft flight parameters and/or environmental conditions. Such aircraft flight parameters and/or environmental conditions include electric power source status, airspeed, air pressure, altitude, air temperature, humidity, ice detection, ice protection status, angle of attack, and angle of sideslip.

Processor 30 can be configured to control the electrical power provided to electrical heater 16 based on the calculated thermal load and on a target operating temperature of air data probe 12b. For example, processor 30 can calculate a target operating power level based on the calculated thermal load and on the target operating temperature. Processor 30 can be configured to receive, via electrical measurement circuit 24, signals indicative of the measured electrical parameters and to use such signals in combination with determine health of electrical heater 16 based on the measured electrical parameters. For example, in some embodiments, health of electrical heater 16 can be determined, at least in part, based on the measured electrical parameters indicating that the deviation of electrical resistance of resistive heating element 34 from the predicted value exceeds a calculated threshold. In some embodiments, health of electrical heater 16 can be determined, at least in part, based on the measured electrical parameters indicating that the leakage current between resistive heating element 34 and the conductive member 38 of air data probe 12b exceeds the calculated leakage threshold.

Processor 30, in one example, is configured to implement functionality and/or process instructions for execution within probe control/monitor system 14. For instance, processor 30 can be capable of processing instructions stored in program memory. Examples of processor 30 can include any one or more of a microprocessor, a controller, a digital signal processor (DSP), an application specific integrated circuit (ASIC), a field-programmable gate array (FPGA), or other equivalent discrete or integrated logic circuitry.

Aircraft flight parameters and/or environmental conditions are received by probe control/monitor system 14, via aircraft interface 18. Aircraft interface 18 can be used to communicate information between probe control/monitor system 14 and an aircraft. In some embodiments, probe control/monitor system 14 can transmit data processed by probe control/monitor system 14, such as, for example, alert signals. Aircraft interface 18 can also include a communications module. Aircraft interface 18, in one example, utilizes the communications module to communicate with external devices via one or more networks, such as one or more wireless or wired networks or both. The communications module can be a network interface card, such as an Ethernet card, an optical transceiver, a radio frequency transceiver, or any other type of device that can send and receive information. Other examples of such network interfaces can include Bluetooth, 3G, 4G, and Wi-Fi radio computing devices as well as Universal Serial Bus (USB). In some embodiments, communication with the aircraft can be performed via a communications bus, such as, for example, an Aeronautical Radio, Incorporated (ARINC) standard communications protocol. In an exemplary embodiment, aircraft communication with the aircraft can be performed via a communications bus, such as, for example, a Controller Area Network (CAN) bus.

Figure 3:
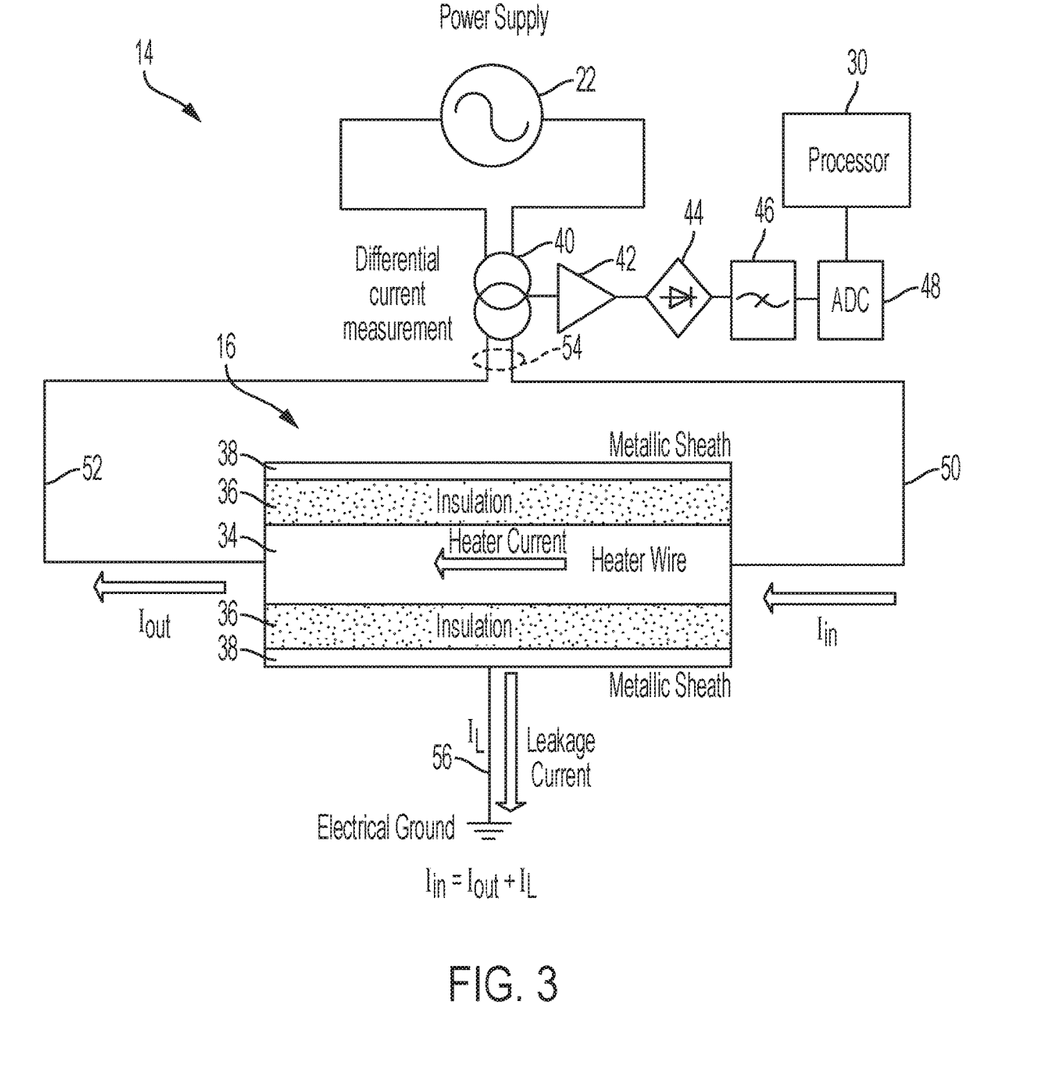
FIG. 3 is a schematic diagram of a differential leakage current health monitoring system.

FIG. 3 is a schematic diagram of a differential leakage current health monitoring system. Shown in FIG. 3 are electric power source 22, electric heater 16, and probe control/monitor system 14. Electric heater includes resistive heating element 34, insulative member 36, and conductive shield 38. Probe control/monitor system 14 includes differential current inductive sensor 40, amplifier 42, rectifier 44, filter 46, analog-to-digital converter 48, and processor 30. Also labeled in FIG. 3 are inlet current $I_{in}$, outlet current $I_{out}$, and leakage current $I_L$. Inlet current $I_{in}$ is the current conducted by resistive heating element 34 at first end 50, and outlet current $I_{out}$ is the current conducted by resistive heating element 34 at second end 52. Leakage current $I_L$ is equal to the difference between Inlet current $I_{in}$ and Outlet current $I_{out}$.

Power cable 54 is depicted schematically, representing an unspecified length of a two-conductor cable is conductively coupled to first 50 and second 52 of resistive heating element 34 so as to provide electrical power thereto. When electrical heater 16 is operating normally, inlet current $I_{in}$ flows into resistive heating element 34 at first end 50 of electric heater 16, and outlet current $I_{out}$ flows out of resistive heating element 34 at second end 52 of electric heater 16. Inlet current $I_{in}$ will be approximately equal to outlet current $I_{out}$ when leakage current $I_L$ is small with respect to inlet and outlet currents $I_{in}$ and $I_{out}$. A typical value of current flow (i.e., $I_{in}$, $I_{out}$) can range from about 1-3 amps (A) for 115V AC power supply probes. Different air data probes can present different thermal loads and can have different electrical heating requirements thereby resulting in various different electrical requirements (e.g., different electrical voltage and/or current ranges). A small amount of leakage current $I_L$ flows through leakage current path 56, schematically represented as flowing from conductive shield 38 to ground (i.e., chassis ground). The relationship between inlet current $I_{in}$, outlet current $I_{out}$, and leakage current $I_L$ can be calculated as follows:

$$I_{in} = I_{out} + I_L \qquad \text{(Equation 1)}$$

A properly functioning heater 20 can experience a nominal value of leakage current $I_L$ by virtue of the nature of insulative member 36. When a newly-manufactured electric heater 16 and associated air data probe is installed, a baseline value of leakage current $I_L$ can be measured and recorded. Such a measured value of leakage current $I_L$ can be referred to as the baseline leakage current $I_{L-BASELINE}$, or as the leakage current $I_{L0}$ at inception. A typical value of baseline leakage current $I_{L-BASELINE}$ can range from about 0.2-50 microamps (μA), but this value can vary over a wide range depending on the particular embodiment of electrical heater 16. For example, in some embodiments, baseline leakage current $I_{L-BASELINE}$ can range up to about 2 milliamps (mA), or higher. In other embodiments, baseline leakage current $I_{L-BASELINE}$ can be less than 0.2 μA.

During operation, leakage current $I_L$ of electric heater 16 can gradually increase as a result of minor degradation of insulative member 36. The normal migration of environmental impurities into insulative member 36 is a non-limiting example of a normal degradation of insulative member 36 during its lifetime. Because operation of electrical heater 16 can be cotemporaneous with flight operation of an aircraft, an expected heater lifetime can be expressed as a measure of flight hours. Several factors (e.g., size of heater 20, physical location of electrical heater 16) can affect the expected lifetime of electrical heater 16 in a particular embodiment, with typical values ranging from about 13K-100K flight hours. Heater end-of-life (EOL) can be associated with a particular threshold value $I_{L-THRESHOLD}$, which can vary depending on the particular embodiment of electrical heater 16. Exemplary values of threshold value $I_{L-THRESHOLD}$ can range from about 2-50 mA.

A relationship between leakage current $I_L$, service life, and expected lifetime can be determined for a particular embodiment of electrical heater 16. Accordingly, the remaining useful life (RUL) can be estimated from a measured value of leakage current $I_L$. Probe control/monitor system 14 can be configured to measure the leakage current $I_L$ throughout the service life of electrical heater 16, thereby providing an indication of RUL while also identifying an abnormal condition that could be indicative of a premature failure of electrical heater 16. Air data probe (i.e., and associated electrical heater 16) can be repaired and/or replaced prior to the End of Life (EOL) or prior to the point of failure so as to avoid an operational delay and interruption (ODI) that could result following a failure. Because replacing an air data probe (i.e., and associated electrical heater 16) can be expensive in terms of time and cost, especially if doing so removes the associated aircraft from operation, it can be desirable to extract the maximum useful service life from electrical heater 16 before repair and/or replacement is performed.

Referring again to FIG. 3 and Equation 1, the value of leakage current $I_L$ can be expressed as being the difference between inlet current $I_{in}$ and outlet current $I_{out}$, as follows:

$$I_L = I_{in} - I_{out} \qquad \text{(Equation 2)}$$

Differential current inductive sensor 40 produces an electrical signal representing the value of leakage current $I_L$, the detail of which will be shown and described later in FIG. 4. Differential current inductive sensor 40 can also be called an inductive leakage current sensor or a differential leakage current inductive sensor. The electrical signal representing the value of leakage current $I_L$ is amplified by amplifier 42, rectified by rectifier 44, and filtered by filter 46, thereby producing a DC voltage level that is representative of the value of leakage current $I_L$. Analog-to-digital converter 48 produces a digital signal representing the DC voltage level provided by filter 46 (i.e., the value of leakage current $I_L$). This can be referred to as a digitized leakage current value. In the illustrated embodiment, amplifier 42 can be an operational amplifier. In other embodiments, other circuit components that perform similar functions to the ones depicted can be used. For example, amplifier 40 can be any electronic circuit that provides amplification, rectifier 42 can be any nonlinear component that provides rectification, and filter 44 can be any component that filters the rectified value. In yet other embodiments, AC-to-DC conversion can be omitted, with an AC voltage being provided from amplifier 40 directly to processor 30.

Referring again to FIG. 3, processor 30 is a digital processor that receives, stores, scales, and processes the digitized leakage current value that is received throughout the lifecycle of electrical heater 16. Processor 30 can receive and process the digitized leakage current value continuously or periodically. In some embodiments, processor 30 can receive multiple inputs corresponding to digitized leakage current values from multiple associated electrical heaters (e.g., associated with multiple air data probes). In other embodiments, processor 30 can receive other inputs associated with electrical heater 16, with non-limiting examples including inlet current $I_{in}$ and/or outlet current $I_{out}$, and/or the voltage level (not labeled in FIG. 3) of electric power source 22. In yet other embodiments, processor 30 can also receive and process data from sources other than leakage current $I_L$ associated with one or more electrical heaters. In an exemplary embodiment, processor 30 can receive data from other aircraft data sources.

In some embodiments, processor 30 can utilize data and signal analysis processing techniques on digitized leakage current values. In these or other embodiments, processor 30 can be a neural network. In some embodiments, prognostic processor 80 can provide information regarding one or more electrical heaters such as, for example, the current value of leakage current $I_L$, the history of leakage current $I_L$ over time (e.g., operating time or calendar time), the service life (i.e., operating time), the expected EOL, and the calculated RUL. The aforementioned data can be provided to other systems (e.g., avionics system) for use by crew members. In these or other embodiments, processor 30 can provide data that can be transmitted and/or downloaded to engineering teams at an airline's operator, maintenance facility, and/or the various component suppliers whereby the data can be reviewed, analyzed, and/or archived.

When installed on a system that includes one or more of the electrical heaters, probe control/monitor system 14 can monitor and/or log metrics of health of each of the electric heaters associated therewith. Such health monitoring can facilitate maintenance personnel to predict when failure is likely to occur so that maintenance can be scheduled prior to the point of expected failure for any particular electric heater 16. Such proactive maintenance scheduling can avoid flight delays that could ground an aircraft for emergent maintenance requirements, as well as preventing in-flight failure of a particular electric heater 16, which can disrupt the performance of an associated air data probe 12.

Figure 4:
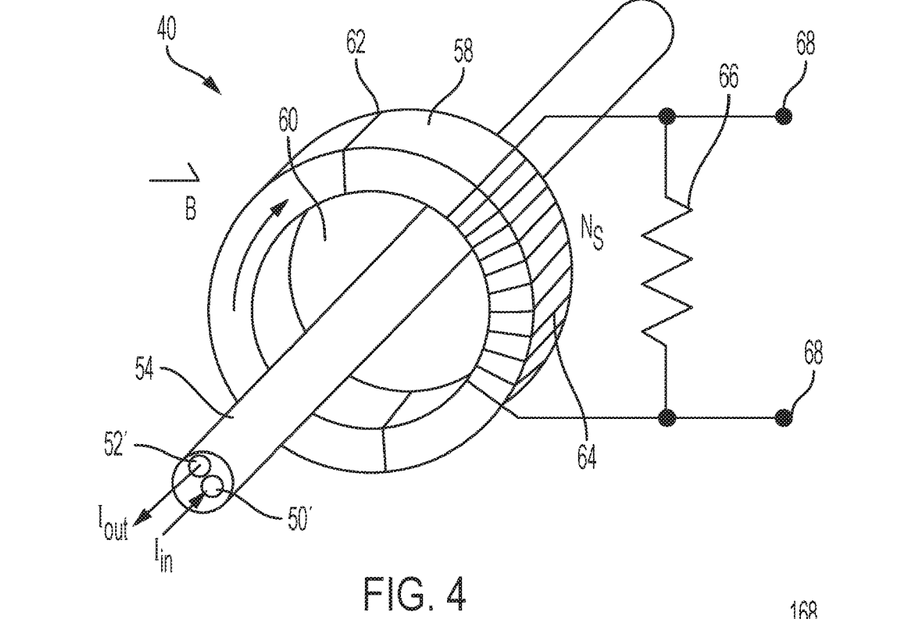
FIG. 4 is a schematic diagram of the differential current inductive sensor shown in FIG. 3.

FIG. 4 is a schematic diagram of differential current inductive sensor 40 shown in FIG. 3. Shown in FIG. 4 are differential current inductive sensor 40, toroid core 58, toroid center region 60, toroid split 62, secondary winding 64, resistor 66, and secondary voltage terminals 68. Power cable 54 provides an electrical connection between electric power source 22 and electric heater 16, as shown and described above in regard to FIG. 3. Power cable 54 has first conductor 50' and second conductor 52'. First conductor 50' is in conductive communication with first end 50 of electric heater 16 and second conductor 52' is in conductive communication with second end 52 of electric heater 16. Each of first and second conductors 50' and 52' can include a central conductive core that is surrounded by an insulating material, and first and second conductors 50' and 52' can be held together by an outer conductive shield (not labeled) to form power cable 54. The insulating material and the outer cable sheath can both be nonmetallic in the region near differential current inductive sensor 40, thereby providing negligible electromagnetic shielding.

In some embodiments, the outer cable sheath of power cable 54 can be omitted. In these or other embodiments, first conductor 50' and second conductor 52' of power cable 54 can be twisted together, or they can be untwisted. Toroid core 58 defines toroid center region 60, thereby providing for the passage therethrough of wires, cables, and the like. In the illustrated embodiment, toroid core 58 has toroid split 62, thereby allowing toroid core 58 to be opened and/or separated into two halves (not labeled in FIG. 4). In some embodiments, toroid split 60 can be omitted from toroid core 58. Power cable 54 can be described as passing through toroid center region 60, as shown in FIG. 4. Power cable 54 can also be described as traversing toroid center region 60.

Referring again to FIG. 4, toroid core 58 is an iron core transformer. In an exemplary embodiment, toroid core 58 is a ferrite core, made from a material that has a relatively high value of magnetic permeability, as may be commonly used in the electrical art as a transformer core. Toroid core 58 can be referred to as a circular transformer core. In some embodiments, toroid core can be made from other materials that are capable of providing electromagnetic coupling, as will be described. The number of turns of the primary ($N_P$) and secondary ($N_S$) winding on toroid core 58, and the electrical wire thickness and insulation, are designed according to the current transformer known design principles.

An alternating current flowing in a conductor passing through a ferrite core induces an alternating magnetic flux Φ (not labeled), thereby creating an alternating magnetic field B, which induces an alternating current in secondary winding 64. The alternating magnetic field B can be annotated with a vector symbol, as shown in FIG. 4. As electrical power is delivered to heater 20 by power cable 14 (e.g., as shown in FIG. 3), inlet current $I_{in}$ flows through power cable 54 in a direction that is opposite to that of outlet current $I_{out}$, with both inlet current $I_{in}$ and outlet current $I_{out}$ flowing through toroid center region 60. Accordingly, the component of alternating magnetic field B associated with inlet current $I_{in}$ is opposite in direction to the component of alternating magnetic field B associated with outlet current $I_{in}$. The difference between inlet current $I_{in}$ and outlet current $I_{out}$ is measured through toroid core 58 primary winding (i.e., power cable 54) and transformed by toroid core 58 to secondary winding 64. This can result in a secondary voltage ($V_S$) value at secondary voltage terminals 68 that is representative of the differential current (i.e., $I_{in}-I_{out}$) flowing through power cable 54 (i.e., primary winding).

If inlet current $I_{in}$ were equal to outlet current $I_{out}$ (i.e., $I_{in}=I_{out}$), then the resulting alternating magnetic field B would be zero because the respective components of alternating magnetic fields B from inlet current $I_{in}$ and outlet current $I_{out}$ are equal in magnitude but opposite in direction. Because leakage current $I_L$ is non-zero as a result of the properties of electric heater 16, as described above in regard to FIG. 3, the resulting alternating magnetic field B that is induced in differential current inductive sensor 40 is proportional to the value of leakage current $I_L$, as shown by Equation 2 above. Accordingly, a secondary voltage ($V_{SECONDARY}$) is induced in secondary winding 64 that is proportional in magnitude to both leakage current $I_L$, and to the number of primary turns $N_P$ and the number of secondary turns $N_S$. It is to be appreciated that in the embodiment, about twelve secondary turns $N_S$ are shown for simplicity. In some embodiments, a greater number of secondary turns $N_S$ can be used to induce a greater secondary voltage ($V_{SECONDARY}$) in secondary winding 64. In an exemplary embodiment, the number of secondary turns $N_S$ can range from about 100-3000. In other embodiments, the number of secondary turns $N_S$ can be fewer than 100 or greater than 3000.

Referring again to FIG. 4, the induced secondary voltage $V_S$ results in current flowing through resistor 66, thereby developing a voltage potential that can be measured at secondary voltage terminals 68. Resistor 66 can be referred to as a burden resistor or output resistor. Accordingly, the secondary voltage at secondary voltage terminals 68 provides an indication that is proportional to the value of leakage current $I_L$. The present embodiment, as shown in FIG. 3, includes amplifier 42, rectifier 44, filter 46, and analog-to-digital converter 48 which together provide a digital signal that is representative of the value of leakage current $I_L$. Accordingly, the secondary voltage at secondary voltage terminals 68 is provided as an input to amplifier 42 shown in FIG. 3.

In a particular embodiment, differential current inductive sensor 40 can be installed while air date probe 12 and associated electric heater 16 are installed on aircraft 10 by passing power cable 54 through toroid center region 60 prior to completing the electrical connections to power cable 54. In the illustrated embodiment, toroid core 58 includes toroid split 62 which can permit differential current inductive sensor 40 to be installed on an existing power cable 54 by opening toroid core 58 at toroid split 62 so that toroid core 52 can be placed around an existing power cable 54 and then secured by rejoining toroid core 58.

Various means of holding together toroid core 58 having toroid split 62 can be used. The resulting configuration in which differential current inductive sensor 40 is installed over an existing power cable 54 can be used on an aircraft (e.g., aircraft 10, as shown in FIG. 1) having installed air data probes 12. The aforementioned method of placing toroid core 58 around an existing power cable 54 can also be used on newly-installed air data probes 12, for example, where power cable 54 is installed in place. Accordingly, the scope of the present disclosure applies to both new installations and retrofits on installed equipment. In a particular embodiment, whereby differential current inductive sensor 40 and probe control/monitor system 14 is installed on an existing (i.e., already in-service) air data probe 12, leakage current $I_L$ that is first measured by probe control/monitor system 14 will be indicative of a value of RUL corresponding to an in-service electric heater 17.

Figure 5:
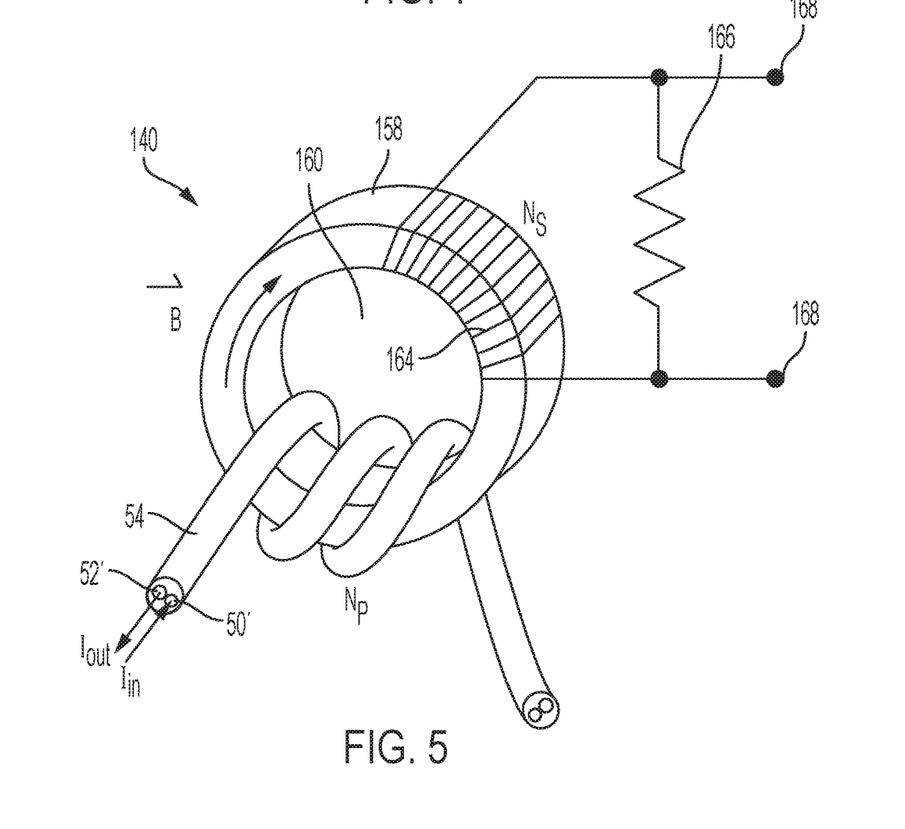
FIG. 5 is a schematic diagram of a second embodiment of the differential current inductive sensor.

FIG. 5 is a schematic diagram of a second embodiment of the differential current inductive sensor. Shown in FIG. 5 are power cable 54, first conductor 50', second conductor 52', differential current inductive sensor 140, toroid core 158, toroid center region 160, secondary winding 164, resistor 166, and secondary voltage terminals 168. The descriptions of power cable 54, first conductor 50', second conductor 52', differential current inductive sensor 140, toroid core 158, toroid center region 160, secondary winding 164, resistor 166, and secondary voltage terminals 168 are substantially as provided above in regard to FIG. 4. A torrid split is not shown in FIG. 5, but can be provided in some embodiments, for example, as described above in regard to FIG. 4.

In the illustrated embodiment, power cable 54 is looped around toroid core 158 three times while passing through toroid center region 160 three times. The number of primary turns $N_P$ can be said to be three, and the resulting alternating magnetic field B for a particular value of leakage current $I_L$ will be approximately three times the value of that produced by a single pass through toroid center region 160 (e.g., as shown in FIG. 4). Accordingly, a greater value of induced secondary voltage $V_S$ can result for a given number of secondary turns $N_S$. The illustrated embodiment shown in FIG. 5 can be beneficial in providing a greater sensitivity in measuring leakage current $I_L$, thereby allowing smaller values of leakage current $I_L$ to be measured and processed by probe control/monitor system 14. This can improve the sensitivity of differential current inductive sensor 140 to smaller values of leakage current $I_L$, and/or improve the measurement resolution of differential current inductive sensor 140. In some embodiments, differential current inductive sensor 140 can include two primary turns $N_P$. In other embodiments, differential current inductive sensor 140 can include four or more primary turns $N_P$. For example, in a particular embodiment, the number of primary turns $N_P$ can range from about 10-20.

The embodiment shown in FIG. 5 is exemplary, and in some embodiments, practically any number of primary turns $N_P$ can be used, given various factors including, for example, the physical sizes of power cable 54 and the physical size of toroid core 158. In an exemplary embodiments shown in FIGS. 4-5, first and second conductors 50' and 52' of electrical heater 16 can each have a wire size of 16 AWG (1.31 mm$^2$ cross-sectional area), power cable 54 can have an outside diameter (not labeled) of about 0.25 inch (6.4 mm), and toroid core 158 can have an inside diameter (not labeled) of about 0.5 inch (12.7 mm). All sizes of power cable 54 and toroid core 158 are within the scope of the present disclosure. Moreover, any size of wire can be used for secondary winding 64, 164. In some embodiments, power cable 54 can include more than two conductors (i.e., first and second conductors 50', 52'). In these or other embodiments, power cable 54 can be sheathed (e.g., braided metallic sheath) in regions other than in the vicinity of toroid core 58, 158. Sheathed power cables 54 can be generally used for connecting a particular electrical heater to electric power source 22 for various reasons (e.g., physical protection, electromagnetic shielding).

Discussion of Possible Embodiments

The following are non-exclusive descriptions of possible embodiments of the present invention.

Apparatus and associated methods relate to a system for monitoring health of an electrical heater of an air data probe. The system includes an electrical power source configured to electrically couple to the electrical heater so as to provide electrical power thereto. The system includes an aircraft interface configured to communicate with an aircraft so as to receive aircraft flight parameters and/or environmental conditions therefrom. The system includes an electrical-property calculator configured to calculate an expected value of an electrical property of the electrical heater based in part on the provided electrical power and further based in part on the aircraft flight parameters and/or environmental conditions. The system includes an electrical measurement circuit configured to electrically couple to the electrical heater so as to measure electrical parameters indicative of the electrical property of the electrical heater. The system also includes a health monitor configured to determine health of the electrical heater based on a comparison between the calculated expected value and the electrical property as indicated by the measured electrical parameters.

The system of the preceding paragraph can optionally include, additionally and/or alternatively, any one or more of the following features, configurations and/or additional components:

A further embodiment of the foregoing system, wherein the electrical heater can include a resistive heating element electrically isolated from a conductive member of the air data probe by an insulative member therebetween.

A further embodiment of any of the foregoing systems, wherein the electrical property can be electrical resistance of the resistive heating element.

A further embodiment of any of the foregoing systems, wherein the measured electrical parameters can include electrical current through the resistive heating element and electrical current difference between first and second ends of the resistive heating element.

A further embodiment of any of the foregoing systems, wherein the electrical property can be leakage current between the resistive heating element and the conductive member of the air data probe.

A further embodiment of any of the foregoing systems, wherein the measured electrical parameters can include first and second current values corresponding to electrical currents conducted by the resistive heating element at first and second ends, respectively, of the resistive heating element.

A further embodiment of any of the foregoing systems, wherein the insulative member can be proximate to and coaxial with the resistive heating element, and the conductive member of the air data probe is a conductive shield proximate to and coaxial with the insulative member.

A further embodiment of any of the foregoing systems, wherein the health monitor can be further configured to generate a health warning signal in response to the electrical property falling outside of a range about the calculated expected value.

A further embodiment of any of the foregoing systems, wherein the range can be within five percent of the calculated actual value.

A further embodiment of any of the foregoing systems, wherein the aircraft flight parameters and/or environment conditions on which the expected value is calculated can include at least one of: electric power source status, airspeed, air pressure, altitude, air temperature, humidity, liquid water content, ice water content, droplet/particle size distribution, angle of attack, and angle of sideslip.

A further embodiment of any of the foregoing systems, wherein the electrical property calculator can be configured to calculate one or more local flowfield properties, based on the received aircraft flight parameters and/or environment conditions.

A further embodiment of any of the foregoing systems, wherein the aircraft flight parameters and/or environment conditions on which the thermal load is calculated can further include static pressure.

A further embodiment of any of the foregoing systems, wherein the electrical measurement circuit can include a differential current inductive sensor 40 configured to generate a signal indicative of leakage current between the resistive heating element and the conductive member of the air data probe.

A further embodiment of any of the foregoing systems, wherein differential current inductive sensor can include a transformer coupling a power cable to a secondary winding.

A further embodiment of any of the foregoing systems, wherein the power cable can have first and second conductor in electrical communication with first and second ends of the resistive heating element.

A further embodiment of any of the foregoing systems can further include the air data probe having a measurement transducer configured to generate a signal indicative of an air data metric.

Some embodiments relate to a method for monitoring health of an electrical heater of an air data probe. The method includes providing, via an electrical power source electrically coupled to the electrical heater, electrical power thereto. The method incudes receiving, via an aircraft interface in communication with an aircraft, aircraft flight parameters and/or environmental conditions therefrom. The method includes calculating, via an electrical-property calculator, an expected value of an electrical property of the electrical heater based in part on the provided electrical power and further based in part on the aircraft flight parameters and/or environmental conditions. The method includes measuring, via an electrical measurement circuit electrically coupled to the electrical heater, electrical parameters indicative of the electrical property of the electrical heater. The method also includes determining, via a health monitor, health of the electrical heater based on a comparison between the calculated expected value and the electrical property as indicated by the measured electrical parameters.

The method of the preceding paragraph can optionally include, additionally and/or alternatively, any one or more of the following features, configurations and/or additional components:

A further embodiment of the foregoing method, wherein the electrical heater can include a resistive heating element electrically isolated from a conductive member of the air data probe by an insulative member therebetween.

A further embodiment of any of the foregoing methods, wherein the electrical property can be electrical resistance of the resistive heating element or leakage current between the resistive heating element and the conductive member of the air data probe.

A further embodiment of any of the foregoing methods can further include providing, via an electrical power source electrically coupled to the electrical heater, electrical power thereto.

A further embodiment of any of the foregoing methods can further include receiving, via an aircraft interface in communication with an aircraft, aircraft flight parameters and/or environmental conditions therefrom.

A further embodiment of any of the foregoing methods can further include calculating, via an electrical-property calculator, an expected value of an electrical property of the electrical heater based in part on the provided electrical power and further based in part on the aircraft flight parameters and/or environmental conditions.

A further embodiment of any of the foregoing methods can further include measuring, via an electrical measurement circuit electrically coupled to the electrical heater, electrical parameters indicative of the electrical property of the electrical heater.

A further embodiment of any of the foregoing methods can further include determining, via a health monitor, health of the electrical heater based on a comparison between the calculated expected value and the electrical property as indicated by the measured electrical parameters.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A system for monitoring health of an electrical heater of an air data probe, the system comprising:
   an electrical power source configured to electrically couple to the electrical heater so as to provide electrical power thereto;
   an aircraft interface configured to communicate with an aircraft so as to receive aircraft flight parameters and/or environmental conditions therefrom;
   an electrical-property calculator configured to calculate an expected value of an electrical property of the electrical heater based in part on the provided electrical power and further based in part on the aircraft flight parameters and/or environmental conditions,
      wherein the electrical heater includes a resistive heating element electrically isolated from a conductive member of the air data probe by an insulative member therebetween; and
      wherein the electrical property is electrical resistance of the resistive heating element and/or leakage current between the resistive heating element and the conductive member of the air data probe;
   an electrical measurement circuit configured to electrically couple to the electrical heater so as to measure electrical parameters indicative of the electrical property of the electrical heater; and
   a health monitor configured to determine health of the electrical heater based on a comparison between the calculated expected value and the electrical property as indicated by the measured electrical parameters.

2. The system of claim 1, wherein the measured electrical parameters include electrical current through the resistive heating element and electrical current difference between first and second ends of the resistive heating element.

3. The system of claim 1, wherein the measured electrical parameters include first and second current values corresponding to electrical currents conducted by the resistive heating element at first and second ends, respectively, of the resistive heating element.

4. The system of claim 1, wherein the insulative member is proximate to and coaxial with the resistive heating element, and the conductive member of the air data probe is a conductive shield proximate to and coaxial with the insulative member.

5. The system of claim 1, wherein the health monitor is further configured to generate a health warning signal in response to the electrical property falling outside of a range about the calculated expected value.

6. The system of claim 5, wherein the range is within five percent of the calculated actual value.

7. The system of claim 1, wherein the aircraft flight parameters and/or environment conditions on which the expected value is calculated include at least one of: electric power source status, airspeed, air pressure, altitude, air temperature, humidity, liquid water content, ice water content, droplet/particle size distribution, angle of attack, and angle of sideslip.

8. The system of claim 1, wherein the electrical-property calculator is configured to calculate one or more local flowfield properties, based on the received aircraft flight parameters and/or environment conditions.

9. The system of claim 8, wherein the electrical-property calculator is configured to calculate the expected value of the electrical property of the electrical heater based, at least in part, on the calculated one or more local flowfield properties.

10. The system of claim 1, wherein the electrical measurement circuit includes a differential current inductive sensor configured to generate a signal indicative of leakage current between the resistive heating element and the conductive member of the air data probe.

11. The system of claim 10, wherein differential current inductive sensor includes a transformer coupling a power cable to a secondary winding.

12. The system of claim 11, wherein the power cable has first and second conductor in electrical communication with first and second ends of the resistive heating element.

13. The system of claim 1, further comprising:
the air data probe having a measurement transducer configured to generate a signal indicative of an air data metric.

14. A method for monitoring health of an electrical heater of an air data probe, the method comprising:
providing, via an electrical power source electrically coupled to the electrical heater that includes a resistive heating element electrically isolated from a conductive member of the air data probe by an insulative member therebetween, electrical power thereto;
receiving, via an aircraft interface in communication with an aircraft, aircraft flight parameters and/or environmental conditions therefrom;
calculating, via an electrical-property calculator, an expected value of an electrical property of the electrical heater based in part on the provided electrical power and further based in part on the aircraft flight parameters and/or environmental conditions,
wherein the electrical property is electrical resistance of the resistive heating element and/or leakage current between the resistive heating element and the conductive member of the air data probe;
measuring, via an electrical measurement circuit electrically coupled to the electrical heater, electrical parameters indicative of the electrical property of the electrical heater; and
determining, via a health monitor, health of the electrical heater based on a comparison between the calculated expected value and the electrical property as indicated by the measured electrical parameters.

15. The method of claim 14, wherein measuring electrical parameters indicative of the electrical property of the electrical heater includes:
measuring electrical current through the resistive heating element at the first end of the resistive heating element;
measuring electrical current through the resistive heating element at the second end of the resistive heating element; and/or
measuring differential current between first and second ends of the resistive heating element, which is indicative of leakage through the heater insulation.

* * * * *